United States Patent [19]

Yamaguchi et al.

[11] 4,024,477
[45] May 17, 1977

[54] RECEIVED SIGNAL FREQUENCY INDICATING SYSTEM

[75] Inventors: Hiroaki Yamaguchi, Anjo; Hiroshi Fujinami, Okazaki, both of Japan

[73] Assignee: Nippon Soken, Inc., Nishio, Japan

[22] Filed: Apr. 30, 1975

[21] Appl. No.: 573,154

[30] Foreign Application Priority Data

May 17, 1974 Japan .............................. 49-56030

[52] U.S. Cl. .............................. 325/455; 324/78 D
[51] Int. Cl.² .................... H04B 1/16; G01R 23/10
[58] Field of Search ............. 325/363, 455; 331/64, 331/65; 324/78 R, 78 D, 79 R, 79 D

[56] References Cited

UNITED STATES PATENTS

| | | | |
|---|---|---|---|
| 3,681,707 | 8/1972 | Bean | 331/64 |
| 3,753,119 | 8/1973 | Close | 325/455 |
| 3,851,242 | 11/1974 | Ellis | 324/40 |
| 3,885,218 | 5/1975 | Pfab | 325/455 |
| 3,911,253 | 10/1975 | Torresdal | 324/79 D |

Primary Examiner—Robert L. Griffin
Assistant Examiner—Marc E. Bookbinder
Attorney, Agent, or Firm—Cushman, Darby & Cushman

[57] ABSTRACT

There is provided a received signal frequency indicating system for indicating a frequency of a signal received by a heterodyne type receiver, and, when a local oscillator signal of the receiver and a d.c. voltage are transmitted through a coaxial cable to a remote place, the received signal frequency is indicated there in a digital form.

1 Claim, 4 Drawing Figures

RECEIVED SIGNAL FREQUENCY INDICATING SYSTEM

BACKGROUND OF THE INVENTION

1. Field of the Invention

This invention relates to a received frequency indicating system using the heterodyne method, which is useful in a case where a radio receiver proper and the indicator section are separated from each other and where the received frequency is indicated by the indicator.

2. Description of the Prior Art

Conventionally, in order to display the frequency of a signal received by a radio receiver, a variable capacitor or an iron core, which rotates mechanically and continuously or moves straightly in a tuning circuit, is used to select a radio frequency. In addition, a pointer is provided which moves mechanically ganged with the displacement of the moving element of the above tuning circuit, so that the movement of the pointer on a scale plate indicates then received signal frequency. In such a prior art system, since the displacement caused by the frequency selection of the radio receiver is transmitted mechanically to an indicator part, the transmission mechanism becomes complicated. Consequently, in the prior art system it has been difficult to separate the indicator from the radio receiver itself. Moreover, it is not possible to extend the distance between the indicator and the radio receiver, and the adjacent arrangement of the receiver and the indicator is unavoidable in the prior art system.

SUMMARY OF THE INVENTION

This invention aims to solve the above-mentioned drawback. A predetermined frequency proper to a heterodyne type receiver is added to or subtracted from the frequency of a local oscillator which takes part in the detection by the receiver, and the resultant value is indicated, whereby the value of the received signal frequency is indirectly and electrically obtained. Thus, it is possible to provide a received signal frequency indicating system in which the accuracy of indication, durability and shock-proof property are remarkably improved. Further, the separation of the receiver from the indicator part can be effected easily.

According to this invention, a received signal frequency is detected and indicated with high accuracy and with no influence by the intensity of the received signal and noise. Further, the separation of the radio receiver proper from the indicator part is easily done. The durability and the shock-proof property are highly improved by means of an electrical construction as compared with those of any conventional system.

DESCRIPTION OF THE PREFERRED EMBODIMENTS

The invention will be explained hereinafter with reference to the accompanying drawings.

Figure 1:
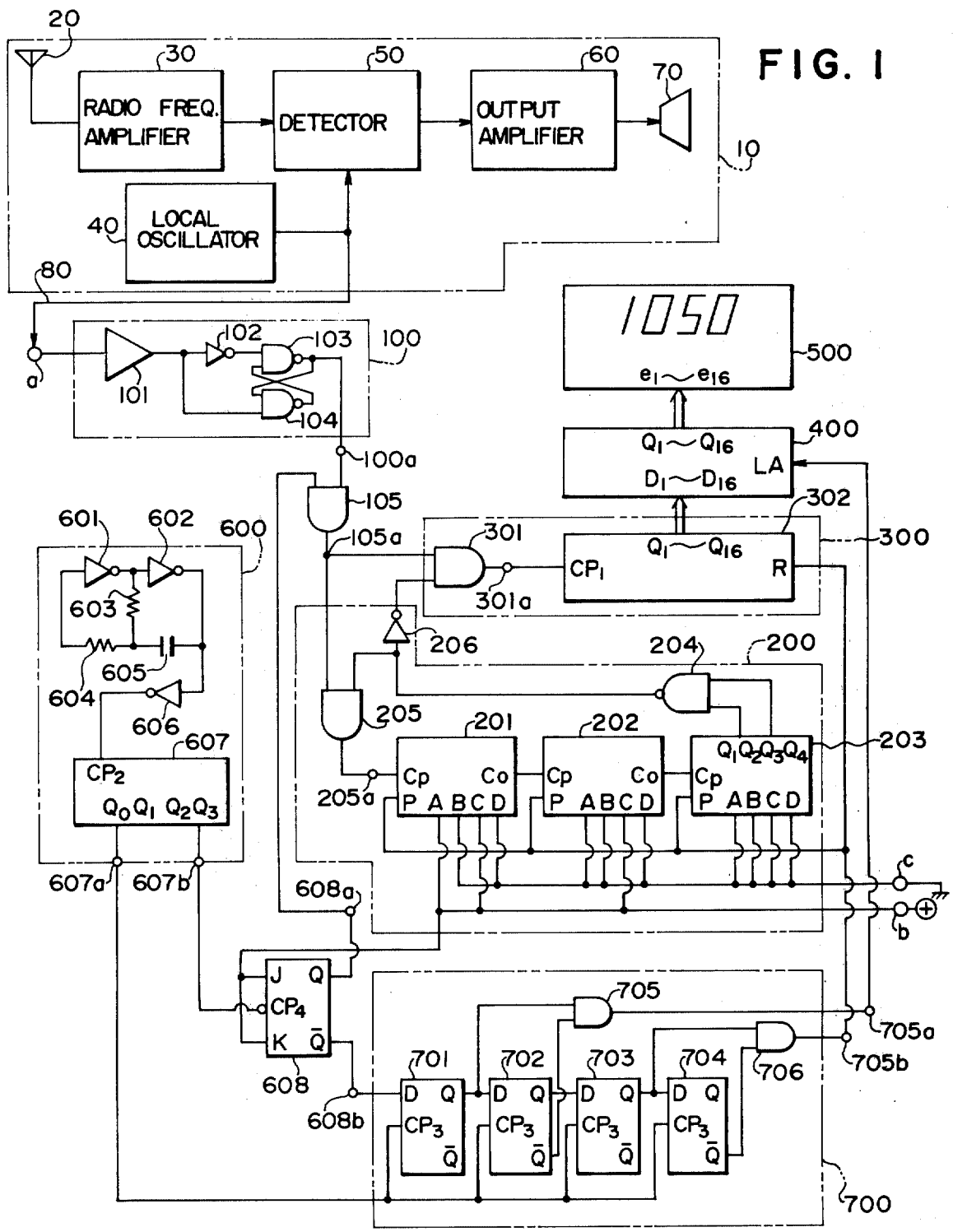
FIG. 1 is an electric wiring diagram showing an embodiment of a received signal frequency indicating system according to this invention.

First, in the electric wiring diagram of FIG. 1 showing an embodiment of this invention, numeral 10 designates a publicly known radio receiver employing a superheterodyne system which is one type of a heterodyne system. An intermediate frequency of a predetermined proper value of 455 $KH_z$ is used for the detection and demodulation. Numeral 20 designates an antenna for receiving electromagnetic waves sent from a transmitter in a radio broadcasting station not shown. Numeral 30 designates a radio frequency amplifier which amplifies a received signal coming from the antenna 20. Numeral 40 designates a local oscillator for the detection purpose, which generates a local oscillator signal with its frequency varied in accordance with the signal with its frequency varied in accordance with the frequency of a desired reception signal. The frequency of the local oscillator is always made higher than that of the reception signal by a predetermined magnitude or an intermediate frequency. Numeral 50 designates a detector which mixes a signal from the radio frequency amplifier 30 with that from the local oscillator 40 to obtain an intermediate frequency signal having the above-mentioned predetermined frequency. The detector 50 amplifies and demodulates this intermediate frequency signal to separate an audio signal from a carrier wave. Numeral 60 designates an output amplifier which amplifies the output of the detector 50 and applied it to a speaker 70 thereby to reproduce the radio broadcast information. The local oscillator signal is taken out from the output terminal of the local oscillator 40 through a wire 80, which acts as a signal takeout means, and is applied to a terminal $a$. Numeral 100 designates a shaping circuit which amplifies the local oscillator signal and reform it into a pulse waveform. Numeral 101 designates a high frequency amplifier which amplifies the local oscillator signal. No detailed explanation of the amplifier 101 is made here, since it is well known in the art. Numeral 102 designates a NOT gate for the purpose of phase invention. Numerals 103 and 104 designate NAND gates which constitute R-S flip-flops. By the combination of the NOT gate 102 and the NAND gates 103 and 104 the output waveform of the high frequency amplifier 101 is steepened at its rising part and converted into a pulse waveform. Numeral 105 designates an AND gate constituting a sampling gate for sampling the pulse waveform. Only when a sampling pulse is applied to its one input, the pulse wave is allowed to pass from other input. The value of the received signal frequency is obtained from the signal passing through the AND gate 105. Numeral 200 designates a first counter circuit for subtracting the intermediate frequency of 455 $KH_z$ which is a predetermined proper frequency of the receiver 10. The counter circuit 200 counts the number of pulses through the AND gate 105 until the count reaches 455. Numerals 201, 202 203 designate decimal counter elements constituting a decimal counter of 3 digits. A decimal counter element of a presettable type capable of presetting a numerical value for the input data, i.e., CD 4029 manufactured by Radio Corporation of America (RCA) in USA, is employed as the counters 201, 202 and 203. The terminal $b$ is connected to a positive power source, while the terminal $c$ is grounded.

Thus, the data inputs A, B, C and D are supplied with a predetermined value 45 so that the count becomes 500 when the number of pulses reaches 455. Numeral 204 designates a NAND gate which generates an output signal for stopping the count when the count of the decimal counter reaches 500, thereby indicating the arrival of 455 pulses. Numeral 205 designates an AND gate for stopping the passage of pulses in response to the output signal of the NAND gate 204. Numeral 206 designates a NOT gate for inverting the phase of the output signal of the NAND gate 204. Numeral 300 designates a second counter circuit for counting the frequency of a signal received by the receiver 10. In synchronism with the stoppage of counting of the counter circuit 200, the counter 300 starts to count the number of pulses coming through the AND gate 105. For example, if the frequency of the local oscillator is 1505 KH$_z$, the count becomes 1050 (= 1505−455), which means that the frequency of the received signal is 1050 KH$_z$. Numeral 301 designates an AND gate which permits the passage of pulses passing through the AND gate 105 in response to the output signal of the NOT gate 206. Numeral 302 is a decimal counter of 4 digits which counts the pulse waveforms passing through the AND gate 301. Here, the element MC 14518 of Motrola Co. USA may be used as the counter 302. Numeral 400 designates a memory circuit which temporaily stores the count of the second counter circuit 300 by applying a 16 bits output signal from the terminals $Q_1$ to $Q_{16}$ of the decimal counter 302 to the terminals $D_1$ to $D_{16}$ as their input data. Thus, the input data are written and stored at the terminals $Q_1$ to $Q_{16}$ when a latch pulse comes to the LA terminal. Numeral 500 is a digital indicator circuit constituting an indicator of the frequency of the received signal. The stored values at the terminals $Q_1$ to $Q_{16}$ of a memory circuit 400 are indicated with a digitized decimal number. For example, HP 7300 manufactured by Hewlett Packard Co., Ltd. USA, employing light emitting diodes, is used as the digital indicator circuit. Numeral 600 designates a clock pulse generating circuit. Numerals 601 and 602 designate NOT gates constituting an oscillator circuit, where numerals 603 and 604 designate feedback resistors and numeral 605 a feedback capacitance. Elements denoted by numerals 601 to 605 constitute a well known oscillator circuit. Numeral 606 designates a NOT gate for reshaping the output signals of the oscillator circuit. Numeral 607 designates a frequency divider circuit which divides the oscillator signal passing through the NOT gate 606. For example, a 4-digit binary counter MC 14520 manufactured by Motrola Co. is used for the frequency divider circuit 607. The first and second clock pulses are taken out from the terminals $Q_0$ $_{and}$ $_{Q3}$, respectively. Numeral 608 designates a J-K flip-flop (hereinafter referred to as J-K-FF) which produces a sampling pulse by one half frequency division of the second clock pulse. The J and K terminals are connected to a positive power source. The sampling pulse is taken out from the Q terminal and applied to the AND gate 105. Numeral 700 designates a control circuit which controls the timing of the operation of the first and second counter circuits 200 and 300 and the memory circuit 400 in accordance with the first clock pulse and an inverted sampling pulse of the $\overline{Q}$ terminal of the J-K-FF 608. Numerals 701, 702, 703 and 704 designate D flip-flops (hereinafter referred to as D-FF) constituting shift registers. The above-mentioned inverted sampling pulse is applied to a D terminal, while the first clock pulse is applied to CP$_3$ terminals so that the input data are successively shifted. Numeral 705 designates an AND gate which effects AND-operation between the terminal Q of the D-FF 701 and terminal $\overline{Q}$ of the D-FF 702 and generates the latch pulse for storing and writing after the disappearance of the sampling pulse. Numeral 706 designates an AND gate which generates a reset pulse for resetting the first and second counter circuits after the above latch pulse is generated. When this reset pulse is applied to the P terminals of the decimal counter elements 201, 202 and 203 of the first counter circuit 200 and to the R terminal of the decimal counter 302 of the second counter circuit 300, the decimal counter elements 201, 202 and 203 are preset to a predetermined value and the counted value of the counter 302 becomes zero and a waiting period is established for the processing of frequency of the next sampling.

In addition to the above-mentioned superheterodyne method, there is used another method in which the frequency of the local oscillator is made lower than the received signal frequency by the magnitude of a predetermined intermediate frequency. In this case the intermediate frequency is added to the frequency of the local oscillator. This method is almost the same in construction as the above-mentioned method and hence no explanation is considered necessary.

Figure 2:
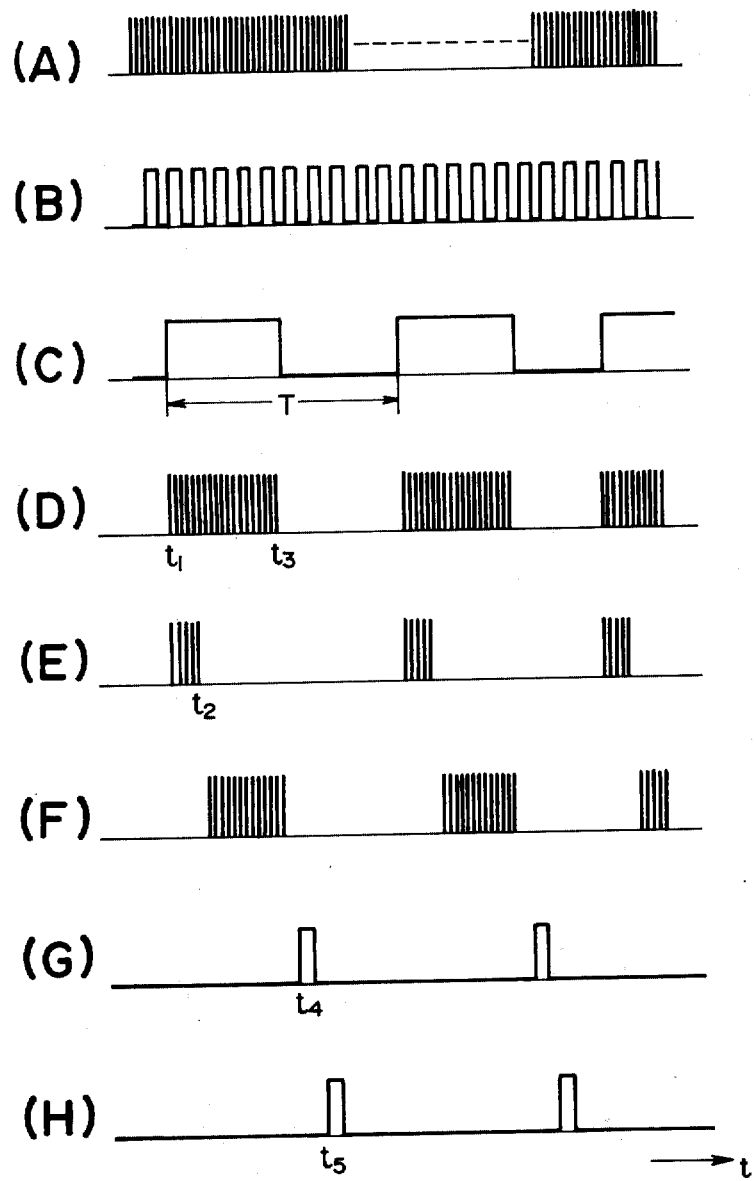
FIG. 2 (A) to (H) show respective waveforms for explaining the operation of this system.

Next, the operation of this invention having the above-mentioned construction will be explained with reference to the waveforms at various portions as shown in FIG. 2. In the figure, symbol A denotes a reshaped signal at the output terminal 100$a$ of the circuit 100 for reshaping the local oscillator signal. Symbol B shows a first clock pulse at the output terminal 607$a$ of the clock pulse generating circuit 600. Symbol C shows a sampling pulse at the output terminal 608$a$ of the J-K-FF 608. Symbol D shows a sampled signal at the terminal 105$a$ of the AND gate 105. Symbol E shows a signal at the output terminal 205$a$ of the AND gate 205. Symbol F shows a signal at the output terminal 301$a$ of the AND gate 301. Symbol G shows a latch pulse at the output terminal 705$a$ of the control circuit 700. Symbol H shows a reset pulse at the output terminal 705$b$ of the control circuit 700. Further, as is well known, in the superheterodyne type receiver 10, the local oscillator oscillates at a frequency higher (or lower) than the frequency of a received signal by the magnitude of an intermediate frequency. The total oscillator signal is mixed with the received signal to take out an intermediate frequency signal to facilitate the succeding amplification of a signal. Denoting the frequency of the received signal of the receiver by $f$, the intermediate frequency by $f_i$, and the local oscillator frequency by $f_o$, we have the following relation;

$$f_o \pm f_i = f$$

Since the intermediate frequency $f_i$ is a constant value properly predetermined for the receiver 10, the received signal frequency can be indirectly determined from the local oscillator frequency if the calculation of the above equation is effected electrically. Thus, regardless of the sensitivity of the receiver and noises occuring therein, it is possible to indicate the received signal frequency stably and continuously.

Let us assume that the local oscillator signal is constantly applied to the input terminal $a$ through the signal lead wire 80. A reshaped signal appearing at the output terminal 100a as shown in FIG. 2(a) is applied to the AND gate 105, which signal is obtained by reshaping the local oscillator signal into a pulse waveform.

Further, the sampling pulse appearing at the output terminal 608a as shown in FIG. 2(c) is applied to the other input of the NAND gate 105, which sampling pulse is obtained by one half frequency division of the second clock pulse appearing at the output terminal 607b of the clock pulse generator 600 by the J-K-FF 608. This sampling pulse is set to have a predetermined period T, and its half period ½T is used as the sampling time and has a time width of $2 \times 10^{-3}$ sec., for example.

Therefore, the sampled signal as shown in FIG. 2(D) is generated at the output terminal 105a of the AND gate 105. The number of pulses per one sampling becomes 1505 when the frequency of the local oscillator signal is 1505 KH$_z$. Since the count of the 3-digit decimal counter in the first counter circuit 200 is set to a predetermined value 45 at time $t_1$, both terminals $Q_1$ and $Q_3$ of the decimal counter element 203 are at L level and hence the output signal of the NAND gate 204 is at H level, so that the AND gate 205 is opened. The first counter circuit 200 counts successively the number of the pulses of the sampled signal shown in FIG. 2(D), which arrive at the terminal 105a, which count is added to the predetermined value 45. When the number of the pulses of the sampled signal after time $t_1$ reaches 455 at time $t_2$, the count of the first counter circuit 200 reaches 500, so that the output signal of the NAND gate 204 takes L level and the AND gate 205 is closed to stop the counting of the first counter circuit. On the other hand, as the output signal of the NAND gate 204 is applied to the AND gate 301 through the NOT gate 206 to open the AND gate 301, the second counter circuit 300 starts to count the number of the pulses of the sampled signal arriving at the terminal 105a after time $t_2$. The count of the second counter circuit 300 between times $t_2$ and $t_3$ becomes equal to the frequency of the local oscillator subtracted by the intermediate frequency with respect to the time axis. For example, if the frequency of the local oscillator signal is 1505 KH$_z$, the count becomes 1050 (= 1505−455). The count of the second counter circuit 300 is temporarily stored in the memory circuit 400 in order to indicate the count continuously during one period T of the sampling pulse. After this storing operation, the first and second counter circuits 200 and 300 are preset and reset, and wait for a next sampling operation. The reset and storing operations are controlled by the reset pulse and the latch pulse generated by the control circuit 700. The input data to the D terminal of the D-FF 701, which is a shift register of the control circuit 700, are the inverted sampling pulses from the terminal 608b which appear at the $\overline{Q}$ terminal of the J-K-FF 608. Since the inverted sampling pulses are maintained at the low level L between the times $t_1$ and $t_2$, all the output signals at the Q terminals of the D-FF 701, 702, 703 and 704 are maintained at the low level L. Therefore, the output signals of the AND gates 705 and 706 are maintained at the low level L and neither a latch pulse nor a reset pulse is generated at the output terminals 705a and 705b. When the inverted sampling pulses change to the high level H at time $t_3$, since the first clock pulse at the terminal 607a is applied to the CP$_3$ terminals of the D-FF 701, 702, 703 and 704, the output signal at the Q terminal of the D-FF 701 is changed to the high level H in synchronism with the first rising point of the first clock pulse after time $t_3$. Accordingly, only when the output signal at the $\overline{Q}$ terminal of the D-FF 702 is at the high level H, the latch pulses shown in FIG. 2(G) are generated at the output terminal 705a. This latch pulse is applied to the LA terminal of the memory circuit 400 in order to store the count of the second counter circuit 300, which counting has been effected between times $t_1$ and $t_3$. Further, similarly to the above-described generation of the latch pulses, in synchronism with third and fourth pulses of the first clock pulse, reset pulses shown in FIG. 2(H) are generated at the output terminal 705b. The reset pulses functions not only to preset predetermined input data in the first counter circuit 200 but also to reset the second counter circuit 300 to place it in the state of waiting for the operation in a next sampling. In this way, the operation for obtaining the value of a received signal frequency is repeated at every period T of the sampling pulses. The digital indicating circuit 500 indicates the result of the operation in accordance with the value stored in the memory circuit 400. For example, when the frequency of the local oscillator signal is 1505 KH$_z$, the digital indicating circuit 500 indicates the decimal number 1050 to show that the received signal frequency is 1050 KH$_z$.

In the embodiment shown in FIG. 1, the operation of subtraction is accomplished by performing series operation in respect of the time axis by means of the first and second counter circuits 200 and 300. However, a parallel operation may be employed as shown in a second embodiment shown in FIG. 3.

Figure 3:
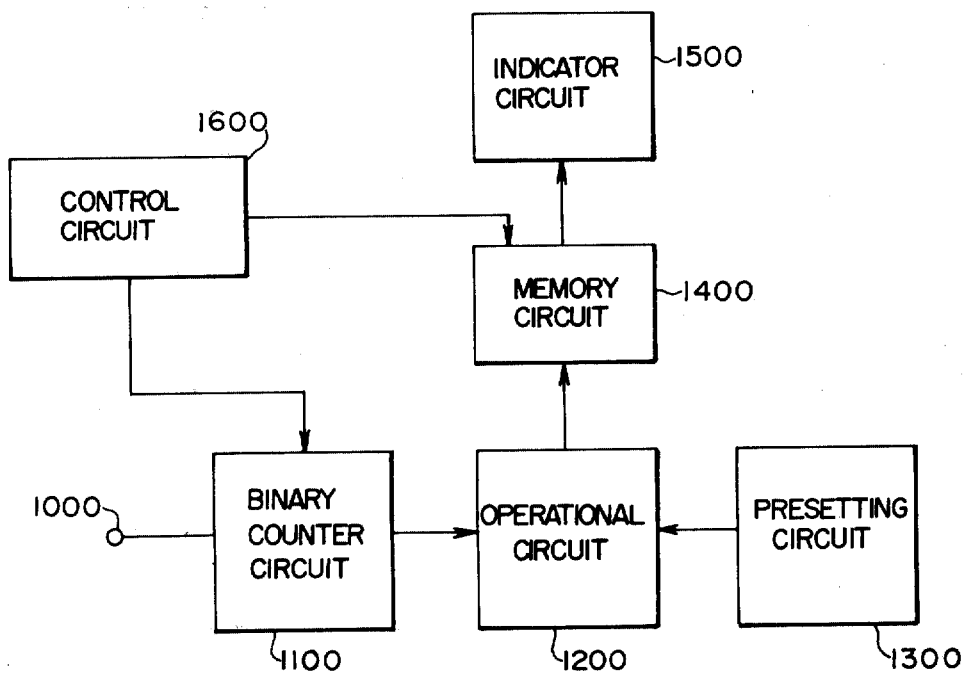
FIG. 3 is a main block diagram showing another embodiment of this system.

In the second embodiment shown in FIG. 3, a signal to be sampled, which appears at the terminal 105a in the embodiment shown in FIG. 1, is applied to the input terminal 1000. Numeral 1100 designates a binary counter circuit which counts the number of the pulses of the sampled signal at every sampling, and it obtains the value of the frequency of the local oscillator signal. Numeral 1200 designates an operational circuit which calculates the value of a received signal frequency from the frequency of a local oscillator signal. Numeral 1300 designates a presetting circuit for setting data to be preset corresponding to an intermediate frequency. Numeral 1400 designates a memory circuit which temporarily stores the result of operation by the operational circuit 1200. Numeral 1500 designates an indicator circuit which indicates the value stored in the memory circuit 1400. Numeral 1600 designates a control circuit for controlling the timing of operation of the binary counter circuit 1100 and the memory circuit 1400. The construction of the control circuit 1600 is the same as that of the control circuit 700 shown in FIG. 1. The operation of this system will be explained hereinafter.

The counter circuit 1100 counts the number of the pulses of the sampled signal, which are obtained by sampling the local oscillator signal and which arrive at the input terminal 1000, to thereby obtain a count corresponding to the frequency of the local oscillator signal. The count and the data corresponding to the intermediate frequency preset in the presetting circuit 1300 are applied to the operational circuit 1200 where value corresponding to the frequency of the received signal is obtained by subtraction. The operated value is temporarily stored in the memory circuit 1400. The stored value is applied to the indicator circuit 1500 to indicate the frequency of the received signal. If the operation is performed by a binary code binary to decimal conversion is necessary prior to the indication. The control circuit 1600 generates a reset pulse and a latch pulse for the counter circuit 1100 and the memory circuit 1400 to place them in a state of waiting for a next sampling.

Although in the above-described embodiment there has been shown a digital indicator circuit using light emitting diodes, it will be apparent to those skilled in the art that other indicating devices such as numeral indicating tubes, fluorescent indicating tubes, plasma displays, liquid crystal, electroluminescence, etc., may be used.

Furthermore, in the above-described embodiments the indication becomes random until a first one cycle of the sampling is completed immediately after the power is supply to the system is turned on. But it is of no problem if the time length of such one cycle is shorter than the response time of human eye. Even though the time length of such one cycle is longer, the problem can be overcome by providing a timer circuit or a counter circuit for eliminating the initial indication.

Further, it is possible also to use an indicator element having afterimage effect in the indicator circuits 500 and 1500, whereby the numeral image is maintained even after the indicator element is de-energized, and to use a gate circuit, instead of the memory circuits 400 and 1400, to thereby allow the operated value of the frequency of the received signal to pass therethrough and apply it to the indicator circuits 500 and 1500 only upon arrival of a latch pulse.

Figure 4:
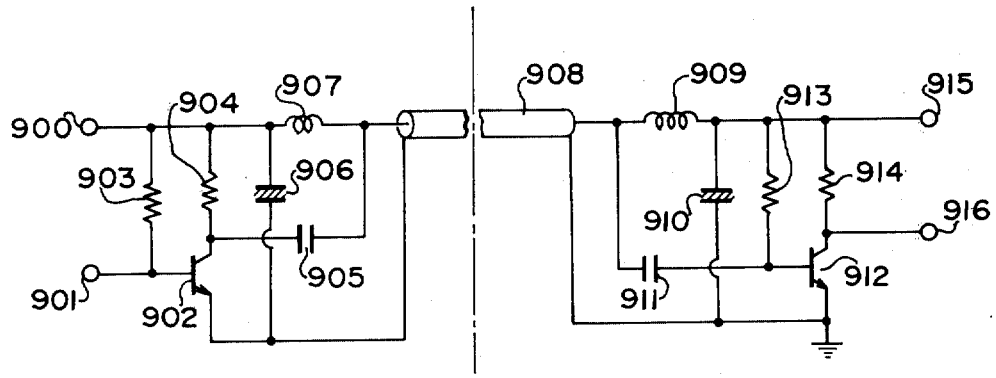
FIG. 4 is an electric wiring diagram showing a further embodiment of lead wire means of this invention.

The measure for taking out the local oscillator signal from the receiver 10 is not limited to the employment of the signal lead wire 80 which is separated from the power supply lead wire and conducts only the local oscillator signal from the output terminal of the local oscillator 40. As seen from the embodiment shown in FIG. 4, a common lead wire, which serves both as a power supply lead wire and a signal lead wire, may be employed. In the wiring diagram of FIG. 4, numeral 900 designates a power supply terminal to which the power supply voltage of the radio receiver 10 is applied. Numeral 901 designates an input terminal to which the local oscillator signal is applied. Numeral 902 designates a transistor for amplifying the local oscillator signal, which is connected to the power supply terminal 900 through a base resistor 903 and a collector resistor 904. Numeral 905 designates a capacitor for a.c. coupling. Numerals 906 and 907 designate a capacitor and an inductor, respectively, which constitute a low pass filter. One end of the inductor 907 is connected to one end of the capacitor 905 and there is generated a composite signal comprising the d.c. power supply voltage and the local oscillator signal superimposed on the former. Numeral 908 designates a coaxial cable comprising a common lead wire for transmitting the composite signal and also an earth lead wire. Numerals 909 and 910 designate an indicator and a capacitor for constituting a low pass filter which serves to separate only the d.c. power supply voltage from the composite signal transmitted on the coaxial cable 908. Numeral 911 designates a capacitor for a.c. coupling which serves to separate only the local oscillator signal from the composite signal. Numeral 912 designates a transistor for amplifying the local oscillator signal separated by the capacitor 911. The transistor 912 is connected to an output terminal 915 of the low pass filter through a base resistor 913 and a collector resistor 914. The local oscillator signal is amplified and taken out from a terminal 916, and then it may be applied to the terminal *a* in FIG. 1. With such a construction, if a circuit comprising the elements 900 to 907 is provided in the receiver, no more lead wire is necessary other than a single coaxial cable 908, which makes it easier to separate the receiver part 10 from the indicator part. The distance of separation between the receiver part and the indicator part can be freely selected within the range suitable for practical use without any limitation. Therefore, when this system issued in an automobile, it is possible to place only the indicator part in front of a driver or an occupant and to place the receiver part under a seat or on the side of a seat, which is advantageous for the improvement of danger prevention in the event of front collision of automobiles, since obstacles in front of a driver on an occupant can be reduced.

What is claimed is:

1. A received signal frequency indicating system comprising:
    lead wire means connected to a local oscillator of a heterodyne type receiver for taking out a local oscillator signal from said receiver, said lead wire means comprising a coaxial cable having a first wire and a second wire, said first wire being grounded, d.c. voltage source means having first and second lead wires, both ends of said second wire being connected to said first and second lead wires, respectively, for supplying a d.c. voltage, a first a.c. coupling capacitor being connected to said first lead wire to superimpose said local oscillator signal on said d.c. voltage and a second a.c. coupling capacitor being connected to said second lead wire to separate said local oscillator signal from said d.c. voltage, whereby said coaxial cable transmits said d.c. voltage and said local oscillator signal on a single wire;
    clock pulse generating means for generating clock pulses of a constant frequency;
    frequency dividing means connected to said clock pulse generating means for frequency-dividing said clock pulses to produce a sampling signal having a constant time interval;
    gating means connected to said frequency-dividing means and said lead wire means for enabling passage of said local oscillator signal by said sampling signal to produce a sampled local oscillator signal;
    first counter means connected to said gating means for counting said sampled local oscillator signal to produce a count signal after a first portion of said time interval which is indicative of an intermediate frequency of the receiver;
    second counter means connected to said first counter means and said gating means for counting said sampled local oscillator signal during the remainder of said time interval after said first counter means produces said count signal; and
    indicating means connected to said second counter means for indicating the count accumulated by said second counter means during the remainder of said time interval, whereby the received signal frequency is continuously displayed irrespective of said sampling signal.

* * * * *